United States Patent
Ota

(10) Patent No.: US 7,193,465 B2
(45) Date of Patent: Mar. 20, 2007

(54) VARIABLE GAIN AMPLIFIER CAPABLE OF FUNCTIONING AT LOW POWER SUPPLY VOLTAGE

(75) Inventor: Masahiko Ota, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 133 days.

(21) Appl. No.: 10/964,460

(22) Filed: Oct. 12, 2004

(65) Prior Publication Data
US 2005/0083125 A1   Apr. 21, 2005

(30) Foreign Application Priority Data
Oct. 15, 2003   (JP) .............................. 2003-355614

(51) Int. Cl.
*H03F 3/45* (2006.01)
(52) U.S. Cl. ...................................... 330/254
(58) Field of Classification Search ................ 330/254; 327/359
See application file for complete search history.

(56) References Cited

U.S. PATENT DOCUMENTS 5,896,063 A * 4/1999 Marsh et al. ............... 330/254
5,920,810 A * 7/1999 Finol et al. ................. 455/313

FOREIGN PATENT DOCUMENTS

JP         2001-007667         1/2001

* cited by examiner

*Primary Examiner*—Steven J. Mottola
(74) *Attorney, Agent, or Firm*—Brinks Hofer Gilson & Lione

(57) ABSTRACT

A variable gain amplifier contains first and second amplifying elements for signal amplification, which are differentially connected to a first constant current source. Third and fourth amplifying elements for gain control are differentially connected to a signal input terminal connected to a second constant current source. Fifth and sixth amplifying elements for gain control are differentially connected to a signal input terminal connected to a third constant current source. In addition, an output terminal of the first amplifying element is connected to the second constant current source and an output terminal of the second amplifying element is connected to the third constant current source. The first constant current source is connected to a high potential terminal of a power source and the second and third constant current sources are connected to a low potential terminal of the power source.

2 Claims, 1 Drawing Sheet

VARIABLE GAIN AMPLIFIER CAPABLE OF FUNCTIONING AT LOW POWER SUPPLY VOLTAGE

This application claims the benefit of priority to Japanese Patent Application No. 2003-355614filed on October 15, 2003 herein incorporated by reference.

BACKGROUND OF THE INVENTION

1. Field of the Invention

The present invention relates to a differential type variable gain amplifier such as a variable gain differential amplifier.

2. Description of the Related Art

FIG. 2 shows the structure of a conventional variable gain differential amplifier. A balanced signal is input to bases of signal amplifying transistors 7 and 7a differentially connected to a constant current source 8. In addition, variable gain amplifiers A and B are connected to collectors of the signal amplifying transistors 7 and 7a, respectively. The variable gain amplifier A amplifies a positive phase signal and the variable gain amplifier B amplifies a negative phase signal. The variable gain amplifier A has gain control transistors 6 and 10, and the variable gain amplifier B has gain control transistors 10a and 6a. A gain control voltage 12 is applied to bases of the gain control transistors 6 and 6a and a gain control voltage 11 is applied to bases of the gain control transistors 10 and 10a.

Collectors of the gain control transistors 6 and 6a are connected to a power supply terminal 33 via load resistors 4 and 4a, respectively, and collectors of the gain control transistors 10 and 10a are directly connected to a power supply terminal 34. A wiring line inductor 23 is interposed between the power supply terminal 33 and a power source 1, and a wiring line inductor 24 is interposed between the power supply terminal 34 and the power source 1. In addition, the collector of the gain control transistor 6 is connected to an output terminal 5 and the collector of the gain control transistor 6a is connected to an output terminal 5a.

In the above-mentioned structure, a signal amplified by the signal amplifying transistors 7 and 7a is subjected to gain control by the variable gain amplifiers A and B. Then, the signal is output in balance to the output terminals 5 and 5a (for example, see Japanese Unexamined Patent Application Publication No. 2001-007667 (FIG. 4)).

However, in the above-mentioned structure, a voltage of the power supply terminal 33 is divided into four voltages, which are supplied to the constant current source 8, the signal amplifying transistors 7 and 7a, the gain control transistors 6 and 6a of the variable gain amplifiers A and B, and the load resistors 4 and 4a, respectively. As a result, low voltages are supplied, and the signal amplifying transistors 7 and 7a and the gain control transistors 6 and 6a operate in low voltages, which consequently results in insufficient performances. To solve this problem, it is necessary to increase the voltage supplied. However, increasing the voltage is inappropriate in portable apparatuses using a battery as a power source.

SUMMARY OF THE INVENTION

Accordingly, the present invention is designed to solve the above-mentioned problems, and it is an object of the present invention to provide a variable gain amplifier capable of increasing the voltage applied to an amplifying element for signal amplification and an amplifying element for gain control and which is capable of providing a sufficient performance even when a voltage of a power source is low.

In order to achieve the above-mentioned object, a first aspect of the present invention provides a variable gain amplifier that comprises first and second amplifying elements for signal amplification, the first and second amplifying elements being differentially connected to a first constant current source; third and fourth amplifying elements for gain control, the third and fourth amplifying elements being differentially connected to a signal input terminal connected to a second constant current source; and fifth and sixth amplifying elements for gain control, the fifth and sixth amplifying elements being differentially connected to a signal input terminal connected to a third constant current source, wherein an output terminal of the first amplifying element is connected to the second constant current source and an output terminal of the second amplifying element is connected to the third constant current source, and wherein the first constant current source is connected to a high potential terminal of a power source and the second and third constant current sources are connected to a low potential terminal of the power source.

Further, in a second aspect of the present invention, the first constant current source and the first and second amplifying elements are composed of a P-channel MOS field-effect transistor, and the second and third constant current sources and the third to sixth amplifying elements are composed of an N-channel MOS field-effect transistor.

Furthermore, in a third aspect of the present invention, the first constant current source and the first and second amplifying elements are composed of a PNP transistor, and the second and third constant current sources and the third to sixth amplifying elements are composed of an NPN transistor.

DESCRIPTION OF THE PREFERRED EMBODIMENTS

Figure 1:
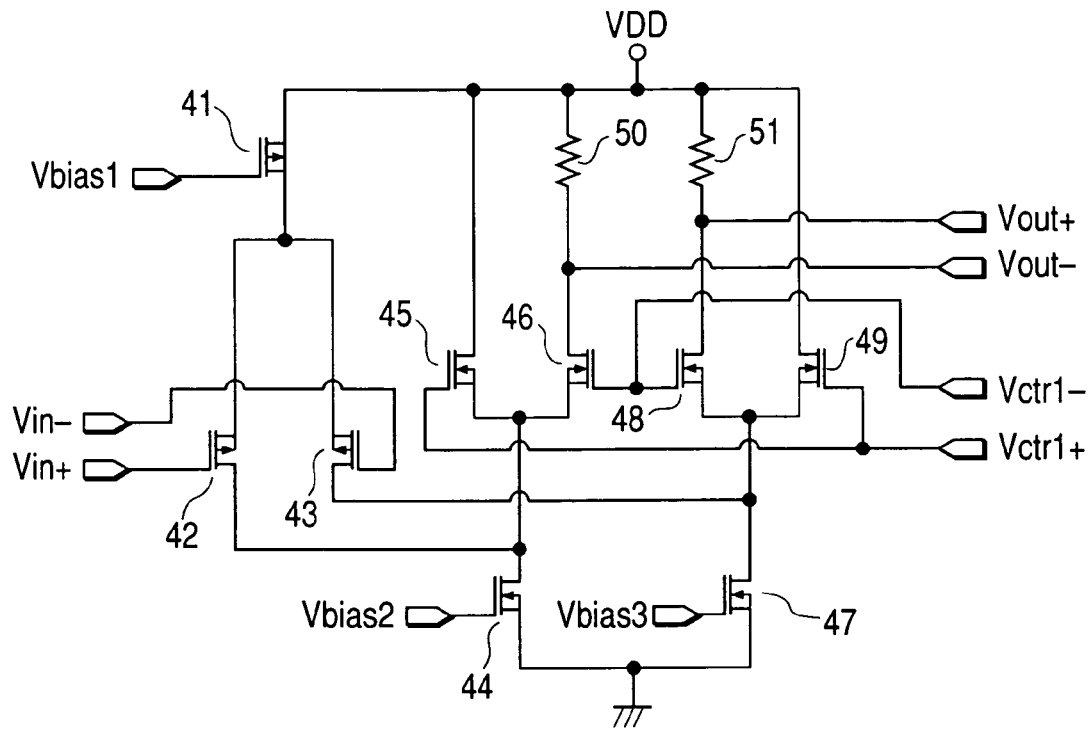
FIG. 1 is a circuit diagram showing the structure of a variable gain amplifier according to the present invention.
Figure 2:
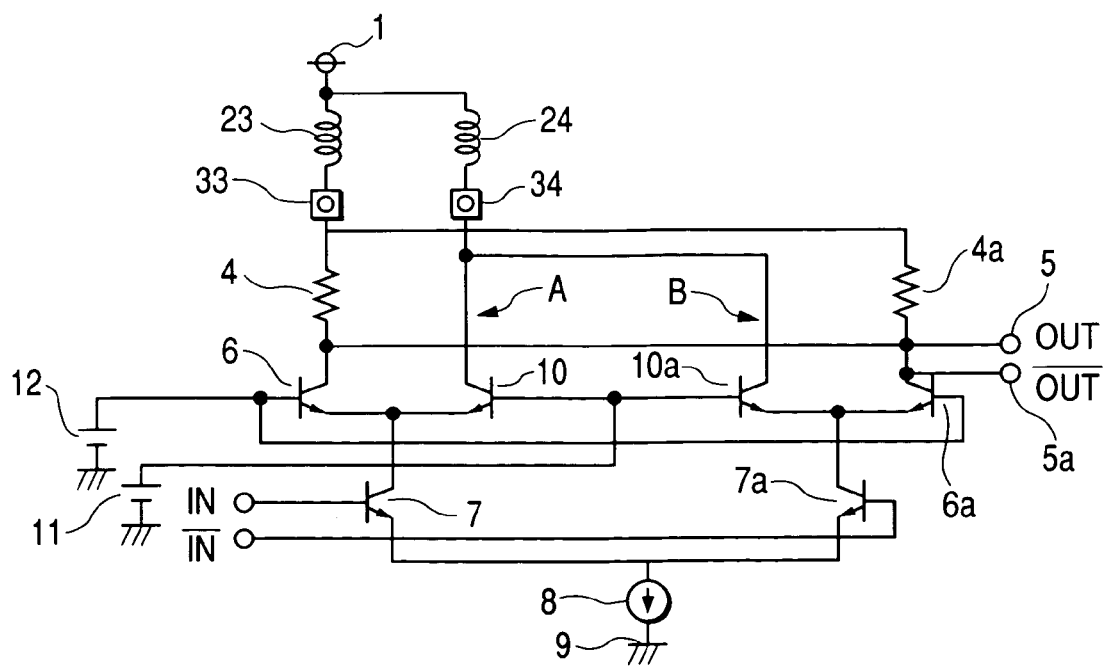
FIG. 2 is a circuit diagram showing the structure of a conventional variable gain amplifier.

FIG. 1 shows the structure of a variable gain amplifier according to the present invention. A first constant current source 41 is composed of, for example, a P-channel MOS field-effect transistor (hereinafter, the field-effect transistor is referred to as an FET). A source of the variable gain amplifier is connected to a high potential terminal Vdd of a power source. A bias voltage Vbias1 for allowing a constant current to flow is applied to a gate of the variable gain amplifier. Further, a first amplifying element 42 and a second amplifying element 43 also are composed of, for example, a P-channel MOSFET, and are differentially connected to each other via the sources thereof. In addition, the sources of the first amplifying element 42 and the second amplifying element 43 are connected to a drain of the first constant current source 41.

A second constant current source 44 and a third constant current source 47 are composed of, for example, an N-channel MOSFET. Sources of the second and third constant current sources 44 and 47 are connected to a low potential terminal (ground) of a power source. A bias voltage Vbias2 and a bias voltage Vbias3 for allowing the same constant current to flow are applied to gates of the second and third constant current sources 44 and 47, respectively. Further, the drain of the first amplifying element 42 is connected to the drain of the second constant current source 44 and the drain of the second amplifying element 43 is connected to the drain of the third constant current source 47. Furthermore, high frequency signals are input in balance to the gate serving as an input terminal of the first amplifying element 42 and the gate serving as an input terminal of the second amplifying element 43.

A third amplifying element 45 for gain control and a fourth amplifying element 46 for gain control are composed of an N-channel MOSFET. Sources serving as input terminals of the third and fourth amplifying elements 45 and 46 are differentially connected to each other and are connected to the drain of the second constant current source 44. In addition, the drain serving as an output terminal of the third amplifying element 45 is connected to the high potential terminal Vdd, and the drain serving as an output terminal of the fourth amplifying element 46 is connected to the high potential terminal Vdd via a first load resistor 50.

In addition, a fifth amplifying element 48 for gain control and a sixth amplifying element 49 for gain control are composed of an N-channel MOSFET. Sources serving as input terminals of the fifth and sixth amplifying element 48 and 49 are differentially connected to each other and are connected to the drain of the third constant current source 47. In addition, a drain serving as an output terminal of the fifth amplifying element 48 is connected to the high potential terminal Vdd via a second load resistor 51, and a drain serving as an output terminal of the sixth amplifying element 49 is connected to the high potential terminal Vdd.

A gate serving as a control terminal of the third amplifying element 45 is connected to a gate serving as a control terminal of the sixth amplifying element 49, and a gate serving as a control terminal of the fourth amplifying element 46 is connected to a gate serving as a control terminal of the fifth amplifying element 48. Also, a gain control voltage is input in balance to the gates of the third and sixth amplifying elements 45 and 49 and to the gates of the fourth and fifth amplifying elements 46 and 48. In addition, signals are output in balance from the drain of the fourth amplifying element 46 and the drain of the fifth amplifying element 48.

According to the above-mentioned structure, seeing a current flow path from the first constant current source 41 to the second and third constant current sources 44 and 45, the voltage of the power source is divided into three stages, i.e., the first constant current source 41, the first and second amplifying elements 42 and 43, and the second and third constant current sources 44 and 47. In addition, seeing a current flow path from the first and second load resistors 50 and 51 to the second and third constant current sources 44 and 47, the voltage of the power source is divided into three stages, i.e., the first and second load resistors 50 and 51, the third to sixth amplifying elements 45, 46, 48, and 49, and the second and third constant current sources 44 and 47. Therefore, the voltage at every divided stage is larger than that of the conventional art.

In the above-mentioned structure, a current flowing into the first constant current source 41 is divided into a current that flows into the first amplifying element 42 and a current that flows into the second amplifying element 43. In addition, a current flowing into the second constant current source 44 is the same as the sum of a current flowing into the first amplifying element 42 and a total current flowing into the third and fourth amplifying elements 45 and 46. Similarly, a current flowing into the third constant current source 47 is the same as the sum of a current flowing into the second amplifying element 43 and a total current flowing into the fifth and sixth amplifying elements 48 and 49.

Further, the signals output from the drain of the first amplifying element 42 are input to the sources of the third and fourth amplifying elements 45 and 46, and the signals output from the drain-of the second amplifying element 43 are input to the sources of the fifth and sixth amplifying elements 48 and 49.

Furthermore, the gain of the third amplifying element 45 and the gain of the fourth amplifying element 46 vary in a reverse direction by a gain control voltage. Similarly, the gain of the fifth amplifying element 48 and a gain of the sixth amplifying element 49 also vary in a reverse direction by the gain control voltage. However, the gain of the fourth amplifying element 46 and the gain of the fifth amplifying element 48 vary in the same direction by the gain control voltage, and the gain of the third amplifying element 45 and the gain of the sixth amplifying element 49 also vary in the same direction by the gain control voltage. Therefore, the signals that vary by the gain control voltage are output from the drains of the fourth and fifth amplifying elements 46 and 48.

Furthermore, in FIG. 1, the first constant current source 41 and the first and second amplifying elements 42 and 43 are composed of a P-channel MOSFET, and the second and third constant current sources 44 and 47, the third and fourth amplifying elements 45 and 46 and the fifth and sixth amplifying elements 48 and 49 are composed of an N-channel MOSFET. However, the first constant current source 41, the first and second amplifying elements 42 and 43, the second and third constant current sources 44 and 47, the third and fourth amplifying elements 45 and 46, and the fifth and sixth amplifying elements 48 and 49 may be composed of a bipolar transistor. In this case, the first constant current source 41 and the first and second amplifying elements 42 and 43 may be composed of a PNP transistor, and the second and third constant current sources 44 and 47, the third and fourth amplifying elements 45 and 46 and the fifth and sixth amplifying elements 48 and 49 may be composed of an NPN transistor. In addition, an emitter, a base, and a collector of the bipolar transistor may be constituted so as to correspond to a source, a gate, and a drain of each FET.

According to the present invention, there is provided a variable gain amplifier that comprises first and second amplifying elements for signal amplification, the first and second amplifying elements being differentially connected to a first constant current source, third and fourth amplifying elements for gain control, the third and fourth amplifying elements being differentially connected to a signal input terminal connected to a second constant current source; and fifth and sixth amplifying elements for gain control, the fifth and sixth amplifying elements being differentially connected to a signal input terminal connected to a third constant current source, wherein an output terminal of the first amplifying element is connected to the second constant current source and an output terminal of the second amplifying element is connected to the third constant current source, and wherein the first constant current source is connected to a high potential terminal of a power source and the second and third constant current sources are connected to a low potential terminal of the power source. As a result, seeing a current flow path from the first constant current source to the second and third constant current sources, the voltage of the power source is divided into three stages, i.e., the first constant current source, the first to second amplifying elements, and the second and third constant current sources. In addition, seeing a current flow path from the first and second load resistors to the second and third constant current sources, the voltage of the power source is divided into three stages, i.e., the first and second load resistors, the third to sixth amplifying elements, and the second and third constant current sources. As a result, the voltage at every divided stage is larger than that of the conventional art and thus even when a voltage of the power source is low, a sufficient performance can be provided. Accordingly, a variable gain amplifier that is suitable for a portable apparatus having a low voltage of the power source can be obtained.

Further, since the first constant current source and the first and second amplifying elements are composed of a P-channel MOS field-effect transistor, and the second and third constant current sources and the third to sixth amplifying elements are composed of an N-channel MOS field-effect transistor, an MOS integrated circuit can be obtained.

Furthermore, since the first constant current source and the first and second amplifying elements are composed of a PNP transistor, and the second and third constant current sources and the third to sixth amplifying elements are composed of an NPN transistor, a bipolar integrated circuit can be obtained.

What is claimed is:

1. A variable gain amplifier comprising:
a first constant current source, a second constant current source, and a third constant current source;
differentially-connected first and second amplifying elements for signal amplification;
differentially-connected third and fourth amplifying elements for gain control; and
differentially-connected fifth and sixth amplifying elements for gain control,
wherein the first constant current source and the first and second amplifying elements are composed of a PNP transistor,
wherein the second and third constant current sources and the third to sixth amplifying elements are composed of an NPN transistor,
wherein drains of the first and second amplifying elements are connected to each other at a node, and the node is connected to a first terminal of the first constant current source,
wherein sources of the third and fourth amplifying elements are connected to each other at a node, and the node is connected to a source of the first amplifying element,
wherein sources of the fifth and sixth amplifying elements are connected to each other at a node, and the node is connected to a source of the second amplifying element,
wherein a second terminal of the first constant current source is connected to a high potential terminal of a power source,
wherein a first terminal of the second constant current source is connected to the node of the sources of the first, third, and fourth amplifying elements, and a second terminal of the second constant current source is connected to a low potential terminal of the power source, and
wherein a first terminal of the third constant current source is connected to the node of the sources of the second, fifth, and sixth amplifying elements, and a second terminal of the third constant current source is connected to the low potential terminal of the power source.

2. A variable gain amplifier comprising:
a first constant current source, a second constant current source, and a third constant current source;
differentially-connected first and second amplifying elements for signal amplification;
differentially-connected third and fourth amplifying elements for gain control; and
differentially-connected fifth and sixth amplifying elements for gain control,
wherein the first constant current source and the first and second amplifying elements are formed by P-channel MOS field-effect transistors,
wherein the second and third constant current sources and the third to sixth amplifying elements are formed by N-channel MOS field-effect transistors,
wherein drains of the first and second amplifying elements are connected to each other at a node, and the node is connected to a first terminal of the first constant current source,
wherein sources of the third and fourth amplifying elements are connected to each other at a node, and the node is connected to a source of the first amplifying element,
wherein sources of the fifth and sixth amplifying elements are connected to each other at a node, and the node is connected to a source of the second amplifying element,
wherein a second terminal of the first constant current source is connected to a high potential terminal of a power source,
wherein a first terminal of the second constant current source is connected to the node of the sources of the first, third, and fourth amplifying elements, and a second terminal of the second constant current source is connected to a low potential terminal of the power source, and
wherein a first terminal of the third constant current source is connected to the node of the sources of the second, fifth, and sixth amplifying elements, and a second terminal of the third constant current source is connected to the low potential terminal of the power source.

* * * * *